(12) United States Patent
Shimizu et al.

(10) Patent No.: US 8,335,669 B2
(45) Date of Patent: Dec. 18, 2012

(54) GOLF BALL AND MECHANICAL ANALYSIS OF THE SAME

(75) Inventors: Takuichi Shimizu, Saitama-ken (JP); Hideo Matsunaga, Saitama-ken (JP)

(73) Assignee: Bridgestone Sports Co., Ltd., Tokyo (JP)

( * ) Notice: Subject to any disclaimer, the term of this patent is extended or adjusted under 35 U.S.C. 154(b) by 443 days.

(21) Appl. No.: 12/262,658

(22) Filed: Oct. 31, 2008

(65) Prior Publication Data

US 2009/0119079 A1 May 7, 2009

Related U.S. Application Data

(60) Provisional application No. 60/986,034, filed on Nov. 7, 2007.

(51) Int. Cl.
*G06F 17/50* (2006.01)
*G06F 7/60* (2006.01)
*G06F 7/48* (2006.01)
*A63B 57/00* (2006.01)
*A63B 69/36* (2006.01)
*A63B 53/00* (2006.01)

(52) U.S. Cl. ......... 703/2; 703/1; 703/6; 703/7; 473/131; 473/151; 473/324; 473/346; 473/351

(58) Field of Classification Search .......... 473/131–409; 703/1, 2, 6, 7
See application file for complete search history.

(56) References Cited

U.S. PATENT DOCUMENTS

| 6,671,642 | B2* | 12/2003 | Miyamoto et al. | 702/109 |
|---|---|---|---|---|
| 7,027,048 | B2* | 4/2006 | Brombolich | 345/420 |
| 7,089,817 | B2* | 8/2006 | Tsunoda et al. | 73/866.4 |
| 7,223,179 | B2* | 5/2007 | Tsunoda | 473/324 |
| 7,254,492 | B2* | 8/2007 | Miyamoto et al. | 702/44 |
| 7,415,398 | B2* | 8/2008 | Naito et al. | 703/6 |
| 7,435,089 | B2* | 10/2008 | Sato et al. | 434/252 |
| 8,190,413 | B2* | 5/2012 | Matsunaga | 703/7 |
| 2002/0023508 | A1* | 2/2002 | Miyamoto | 73/866 |
| 2003/0008728 | A1* | 1/2003 | Miyamoto et al. | 473/351 |
| 2003/0222871 | A1* | 12/2003 | Brombolich | 345/427 |
| 2007/0010342 | A1* | 1/2007 | Sato et al. | 473/151 |
| 2007/0015601 | A1* | 1/2007 | Tsunoda et al. | 473/346 |

(Continued)

FOREIGN PATENT DOCUMENTS

JP 06-124326 A 5/1994

(Continued)

OTHER PUBLICATIONS

Jog et al. "A 27-Node Hybrid Brick and a 21-Node Hybrid Wedge Element for Structural Analysis", 2005.*

(Continued)

*Primary Examiner* — Shambhavi Patel
(74) *Attorney, Agent, or Firm* — Sughrue Mion, PLLC

(57) ABSTRACT

The accuracy or computation speed of mechanical analysis of a golf ball using the finite element method is increased. In the mechanical analysis, a model representing the golf ball is prepared on a computer, and computation is made by the finite element method using elements and nodes. At this time, the elements are made solid elements of hexahedron, the aspect ratio of the shape of each element is set so as to be not lower than 1.0 and not substantially higher than 6.5, and nodes are provided on the sides and at the vertexes of the hexahedron of element.

10 Claims, 6 Drawing Sheets

U.S. PATENT DOCUMENTS

| | | | |
|---|---|---|---|
| 2007/0049393 A1* | 3/2007 | Gobush | 473/131 |
| 2009/0119079 A1* | 5/2009 | Shimizu et al. | 703/7 |
| 2011/0040535 A1* | 2/2011 | Sato | 703/2 |

FOREIGN PATENT DOCUMENTS

| | | |
|---|---|---|
| JP | 11-096398 A | 4/1999 |
| JP | 2000-182081 A | 6/2000 |
| JP | 2002-052096 A | 2/2002 |
| JP | 2003-169864 A | 6/2003 |
| JP | 2003-288382 A | 10/2003 |
| JP | 2004-13652 A | 1/2004 |
| JP | 2007-001378 A | 1/2007 |

OTHER PUBLICATIONS

Ansys/LS-DYNA User's Guide, May 2004.*

Chiu, Jinn-Tong. "Analysis of the Restitution Characteristics of Golf Ball Colliding with Club-Head", 2004.*

Taylor, Robert. "FEAP—A Finite Element Analysis Program", 2002.*

Shen et al. "Analysis of the Restitution Characteristics of a Golf Ball Colliding with a Club-Head", Japan J. Indust. App!. Math., 22 (2005), 429-442.*

Podpirka et al. "Finite Element Analysis of a Golf Driver and Golf Ball", 2006.*

Mase et al. "Finite Element Analysis of a Golf Driver and Golf Ball", Finite Element Analysis of a Golf Driver and Golf Ball, 2002.*

Liu et al. "Golf Ball Impact: Material Characterization and Transient Simulation", 12th International LS-DYNA® Users Conference 2004.*

Japanese Office Action issued in Japanese Application No. 2008-285229 dated Oct. 23, 2012.

* cited by examiner

US 8,335,669 B2

GOLF BALL AND MECHANICAL ANALYSIS OF THE SAME

CROSS REFERENCE TO RELATED APPLICATIONS

This application claims the benefit of U.S. Provisional Application No. 60/986,034 filed on Nov. 7, 2007, which is hereby incorporated by reference in its entirety.

BACKGROUND

1. Technical Field

The present invention relates to a golf ball and to a mechanical analysis of the golf ball. More particularly, the present invention relates to a golf ball and to an analysis-method for simulating physical properties involving deformation of a golf ball by the finite element method using a model run on a computer.

2. Description of the Related Art

The finite element method is known as a computation method capable of analyzing the properties of an object on a computer by sectioning an intricately-shaped object into discrete elements, and by evaluating any physical quantity in each of the elements. An advantage of the finite element method is that when this method is actually used, even if the user does not necessarily have advanced knowledge of the mechanics of materials and elastodynamics, a phenomenon occurring in the object can be understood. Therefore, the finite element method has been widely used to evaluate various types of structures and objects.

In the finite element method, processing is performed at the outset to generate a collection of elements according to the phenomenon or physical quantity to be evaluated or the construction of object. The mode of generating the elements, which is often called mesh sectioning, is known so as to have a great influence on the computation accuracy of the finite element method.

On the other hand, for an object having a three-dimensional shape close to that of a solid sphere, such as a golf ball, the finite element method is used at the design stage to choose a proper material or determine the construction for the purpose of designing a golf ball that achieves both long carry and good controllability (for example, Japanese Unexamined Patent Application Publication No. 2004-13652, and Japanese Unexamined Patent Application Publication No. 2003-288382).

As one ideal element model used for analyzing the mechanical behavior of an object by using the finite element method, a model in which all the elements are formed by small cubes is available. However, it is difficult to analyze the mechanical behavior of a golf ball by using such a model. The reason for this is that since the golf ball has a spherical shape, difficulties are encountered in sectioning the modeled solid sphere into elements while forming all of the elements by cubes. Therefore, various schemes have been devised from the viewpoint of increasing accuracy and computation speed.

FIGS. 1 and 2 show a conventional element setting method used for simulating a golf ball by using the finite element method. FIG. 1 is a computer display image showing a mesh in a cross section of a conventional golf ball model 100 disclosed in Japanese Unexamined Patent Application Publication No. 2004-13652. In this model 100, an outermost layer zone 106 is sectioned in a fine mesh to make computations. Generally, the number of elements is increased by making the mesh finer, and accordingly, the number of nodes increases, so that the computation accuracy in the outermost layer zone 106 increases. For this model, however, the mesh of an inner layer zone 102 is sectioned so that the volume of each element increases toward the outside. Also, in the element in the inner layer zone 102, the aspect ratio is also high. Therefore, in the case of mesh sectioning as in the model 100, there is a high probability that the model behaves as if a central part 102a of the inner layer zone 102 is harder than the physical property value of a real material, and thus it is difficult to say that a uniform physical property value is reproduced in the innermost layer zone on the computer. Also, in the mesh sectioning in the conventional model 100, since the number of sections only in the outermost layer zone 106 is made large, nodes 106a of the outermost layer zone also exist on the edge line of the solid body constituting the inside element. Therefore, there arises a problem in that there is a high probability that an odd state (separation or stress concentration) will occur between the outermost layer zone 106 and the layer on the inside thereof in computation.

FIG. 2 is a sectional view of a model 200 that simulates a golf ball, the model 200 being disclosed in Japanese Unexamined Patent Application Publication No. 2003-288382. This model 200 has a mesh sectioning such that the elements in an inner layer zone 202 are approximately uniform as compared with the conventional model shown in FIG. 1. The mesh of this model is made such that each of the elements in the inner layer zone 202 is a hexahedron, and the number of nodes of each element is eight (refer to FIG. 3). In this model 200, in order to increase the number of nodes to enhance the computation accuracy, the number of elements must be increased. By the increase in computation amount caused by the increase in the number of elements, much time is required for processing. That is to say, the model 200 has a problem in that it is difficult to shorten the processing time while the computation accuracy is maintained or to enhance the computation accuracy while the processing time is maintained. Also, since the element in the inner layer zone 202 is prepared by designating the interior angle of a quadrangular face, as an outer layer zone 204 or an outermost layer zone 206 is approached from the center, the width of element (a spread of each element, in the three-dimensional sense, for a face perpendicular to the radial direction passing through the center) increases (for example, refer to claims 4 and 5 in Japanese Unexamined Patent Application Publication No. 2003-288382). Therefore, the aspect ratio of such a deformed element, that is, the deformation of the shape of the face from a square tends to increase. When the aspect ratio increases, with respect to the lengthwise direction of the element, the accuracy of approximation of a corresponding portion of an actual golf ball made by the element decreases. Therefore, the above-described model 200 has a problem of decreased computation accuracy.

BRIEF SUMMARY

To solve the above problems, it is necessary to prepare an efficient golf ball model such that the most uniform possible physical properties like those of an actual golf ball are obtained in a zone represented by a hexahedron, and the computation time does not increase significantly, whereas the computation accuracy is increased even in an outermost layer zone in which the aspect ratio is liable to increase.

It has been found that a model satisfying the following three conditions is desirable for analyzing golf balls by the finite element methods.

First, it is desirable that all elements be formed of hexahedrons. In other words, a model in which no tetrahedral element exists is desirable. FIG. 4 shows an example of a tetrahedral element. In the case where such a tetrahedral element exists, each face of the tetrahedral element is triangular, and an element such that the stress approximating method is different from that on the rectangular face of other elements (for example, the elements in the outer layer zone and the outermost layer zone) is produced. Such a difference in approximating method decreases the computation accuracy of the whole.

Second, it is desirable that the aspect ratio of each element be approximately to 1:1, that is, the face of each element be close to a square. The aspect ratio is defined as a ratio of the length of the longest side to the length of the shortest side of all sides of an element. For elements having a high aspect ratio, the approximation accuracy with regard to the direction of the longer side will be decreased. Combining the first and second conditions, an element that is as close to a cube as possible is more favorable.

Third, it is desirable that the number of sections (the number of elements) in the mesh be increased. As the mesh is made finer and the number of elements is increased, the so-called elastic solution is approached and the computation accuracy is increased. However, as described above with regard to FIG. 2, in the conventional art, if the mesh is constructed finely, the number of elements increases, which presents a problem of increasing computation time. Therefore, from the viewpoint of taking practicality into account considering computation time as well, the third condition comes down to a requirement for preparing a model that achieves both high computation accuracy and computation speed, that is, a model capable of enhancing the accuracy without increasing the number of elements.

Problems arising when these conditions are applied to a golf ball are explained in further detail. The first condition poses a problem typically in the case of a model in which tetrahedral elements exist as shown in FIG. 5 (a model 300). In the model 300, an outer layer zone 304 is provided on the outside of an inner layer zone 302, and an outermost layer zone 306 is further provided. In the inner layer zone 302, tetrahedral elements 302a are formed just on the inside of the outer layer zone 304. In this portion, the computation accuracy decreases, which exerts an influence on the computation accuracy of the whole model. Also, since the shape of the golf ball is approximately a solid sphere, the second condition makes it difficult to make all elements in a model simulating the golf ball regular hexahedrons, that is, to standardize the sizes of elements to a uniform size. Furthermore, the third condition brings a problem to light in that the number of sections (the number of elements) of the mesh cannot be set so as to achieve both high computation accuracy and computation speed in any of the above-described models.

An object of the present invention is to solve at least one of the problems while satisfying at least some of the conditions mentioned above.

The present invention provides a method for analyzing mechanical behavior of a golf ball including the steps of preparing a model representing a golf ball by a collection of hexahedral elements; setting nodes at vertexes and sides; and computing mechanical behavior involving deformation of the golf ball by using the finite element method using the elements and nodes of the model, the nodes being used as output points of computation, wherein the aspect ratio of the shape of each of the elements is not lower than 1.0 and is not substantially higher than 6.5. Also, the present invention provides a golf ball analyzed or designed by using the mechanical analysis as described above.

Also, the present invention provides a method for preparing a model representing a golf ball on a computer by using a collection of elements and nodes, the model being used to compute the mechanical behavior involving deformation of the golf ball by the finite element method using the nodes of the element as output points of computation, comprising the steps of: receiving data for generating a collection of elements in the central part of a core zone as central part definition data in the central part of the core zone including the center or the center of gravity of the golf ball by generating hexahedral elements so as to be arranged in the same numbers in each direction of three dimensions; receiving data for generating a collection of elements in the peripheral part of the core zone as peripheral part definition data in the peripheral part of the core zone, which is a zone part ranging from the outermost face of the central part of the core zone to the outside face of the core zone of the golf ball, the elements in the peripheral part of the core zone being specified by combining a collection of radius line segments consisting of line segments which connect the vertexes of the hexahedral elements appearing on the outermost face of the central part of the core zone to the center or the center of gravity and extend on the face of the core zone with a collection of line segments which connect internal division points on the adjacent radius line segments, which internal division points are in the same order as viewed from the center; receiving data for generating a collection of elements of an outer layer zone as outer layer zone definition data in the outer layer zone which is a zone between the outer face of the core zone and the outer face of the outer layer zone, which outer face is the outer face of a sphere containing the core zone, the elements of the outer layer zone being specified by using line segments obtained by extending the radius line segments to the outside in the radial direction of the golf ball; receiving data for generating a collection of elements of an outermost layer zone as outermost layer zone definition data in the outermost layer zone which is a zone between the outer layer zone and the outer face of the outermost layer zone, which outer face is the outer face of a sphere containing the outer layer zone, the elements of the outermost layer zone being specified by using line segments obtained by extending the radius line segments to the outside in the radial direction; generating node data for determining nodes at positions of vertexes and at positions on sides in each of the elements of the core zone, the outer layer zone, and the outermost layer zone; receiving physical property data for simulating the material of the golf ball so as to correspond to the core zone, the outer layer zone, and the outermost layer zone; and generating a collection of elements of the whole of the golf ball by using the central part definition data, the peripheral part definition data, the outer layer zone definition data, and the outermost layer zone definition data, and generating data for computing the mechanical behavior of the golf ball by using a solver so that the generated elements are related to the physical property data and the node data of the zones to which the elements belong.

By using the method for analyzing mechanical behavior in accordance with the present invention, a proper model for simulating a golf ball can be obtained, so that the mechanical behavior of the golf ball reproduced as a model by using the finite element method can be analyzed properly. Thereby, the computation accuracy at the time when the mechanical behavior of the golf ball is analyzed by the finite element method can be enhanced, or the processing speed of computation can be increased while maintaining the same computation accuracy. As a result, for example, the material and construction for increasing the carry can be selected easily. Thereby, a high-performance golf ball can be analyzed or designed easily.

DESCRIPTION OF SYMBOLS

| 10 | mechanical analysis |
|----|---------------------|
| 20 | golf ball model |
| 22 | inner layer zone (core zone) |
| 24 | outer layer zone (intermediate layer) |
| 26 | outermost layer zone (cover zone) |
| 30 | element |
| 32 | node |

DETAILED DESCRIPTION

An embodiment of the present invention will now be described with reference to the accompanying drawings.

The present invention relates to a mechanical analysis in which, for example, a state of striking and the flying of a golf ball is simulated on a computer, and the mechanical behavior of the golf ball is estimated without conducting an experiment or by saving the process of experiment when structural design of a golf ball is made, for example, by determining the materials of an inner layer zone (core), an outer layer zone (intermediate layer), and an outermost layer zone (cover) and the thicknesses of the layers of a three piece type golf ball. In this analysis, the physical quantity or physical property to be analyzed macroscopically involves deformation of the golf ball, further including properties relating to the kinetics of the golf ball such as initial velocity, delivery angle, and spin, and microscopically includes strain and stress in each portion of golf ball. The mechanical behavior to be analyzed includes static behavior in which a change with time does not matter and dynamic behavior in which a transient change matters. Also, the mechanical analysis in accordance with the present invention includes batch processing in which a parameter that changes material and construction continuously or in consecutive order while evaluating the mechanical behavior is presupposed, and repeated computation is performed over a range of that parameter, and optimization processing in which the optimum value of parameter is determined while evaluating the mechanical behavior directly or by using any performance function.

Figure 6:
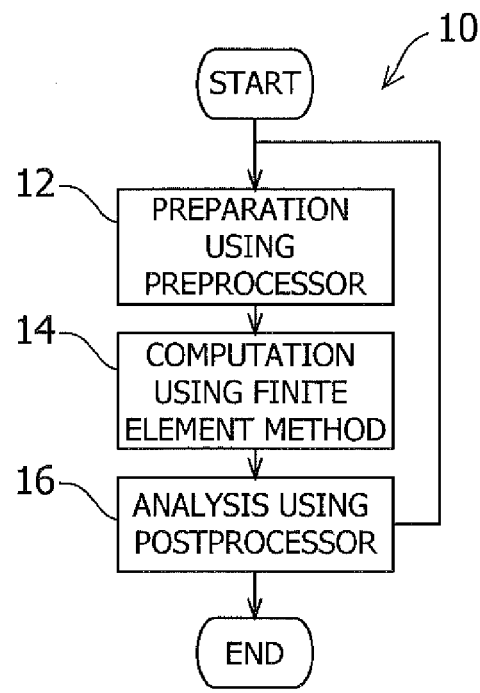
FIG. 6 is a flowchart showing a processing process of a mechanical analysis in accordance with the present invention.

FIG. 6 is a flowchart showing a mechanical analysis 10 in accordance with the present invention. When processing is started, in a preprocessor, preparation such as generation of a golf ball model to be computed is made (Step 12). The details about what model is generated in what way at this time are described later. Next, the mechanical behavior shown by a model is computed on the generated model by using a solver for mainly performing matrix computation (Step 14). The computation at this time is performed by the finite element method. Then, processing for evaluating the computed mechanical behavior and visualizing the computation results is performed by a postprocessor (Step 16). As the result of evaluation using the postprocessor, if the evaluator intends to change the condition, for example, to change the materials of the golf ball or to change the construction thereof, accordingly an improved model is generated again by the preprocessor, or sometimes an improved condition is set. In this case, the improved model involves a change of the coordinates of element caused by the change of layer thickness, and the improved condition includes, for example, a change of material. Thus, in the mechanical analysis in accordance with the present invention, since the analysis using the finite element method is carried out by the generation of model, the subsequent behavior of the computed golf ball model is greatly influenced by what model is prepared, and in turn, the accuracy and speed of the overall computation is also influenced. Next, the features of the finite element method model of a golf ball used for the mechanical analysis in accordance with the present invention are explained.

Figure 7:
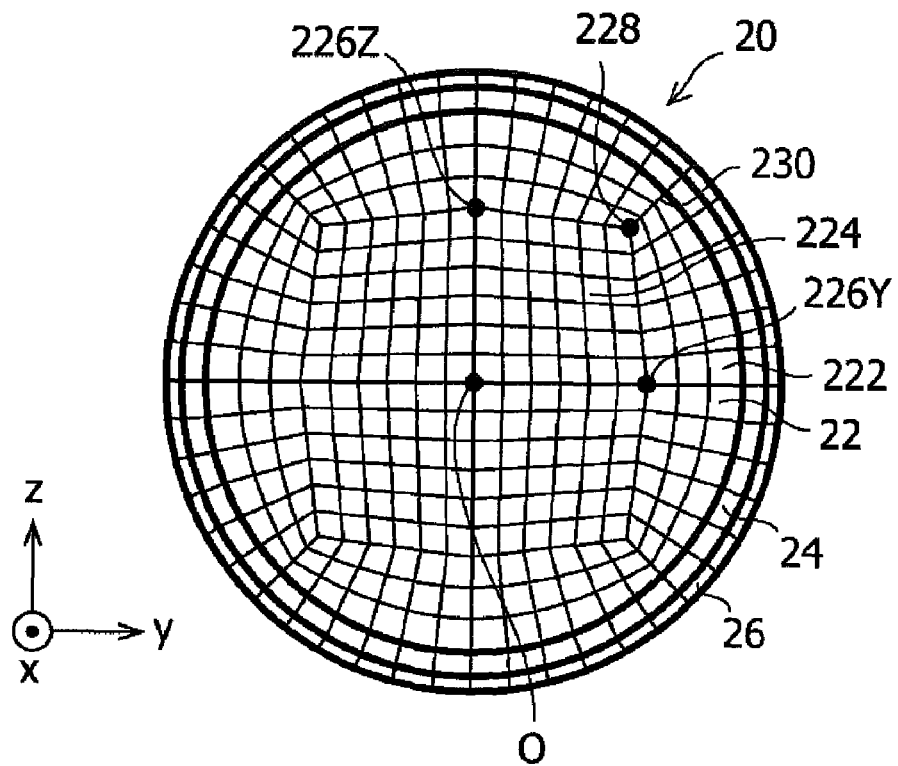
FIG. 7 is a computer display image showing a sectional view of a golf ball model in a mode of the present invention.

FIG. 7 shows a computer display image showing a cross section of a model 20 in accordance with the present invention, which is used for simulating the mechanical behavior of the golf ball on a computer. Also, FIG. 8 is an explanatory view showing the arrangement of nodes 32 in each element 30 in the inner layer zone (core zone) of the model used in the embodiment of the present invention.

The model itself on the computer is represented and defined by a data set recorded on any recording medium that can be read by a computer. Computation using the finite element method is made by using this data set representing the model, and the mechanical behavior of a golf ball, which is an object to be analyzed, is simulated. The data set defining the model includes at least node position data capable of defining each element and data concerning the connection state capable of reproducing the connection between nodes in any form of all data necessary for the computation. The data set optionally includes data concerning the material reflecting the material of each element, and in some cases, also includes other incidental data. The elements and nodes are defined by such data. Hereunder, a model used for the mechanical analysis in accordance with the present invention is explained by indicating a three-dimensional spatial arrangement.

Figure 1:
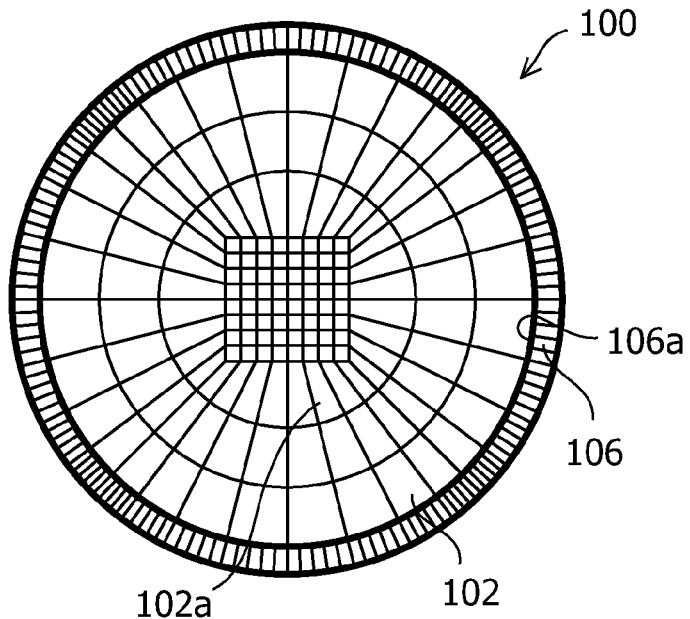
FIG. 1 is a computer display image showing a sectional view in an example of a conventional golf ball model.
Figure 2:
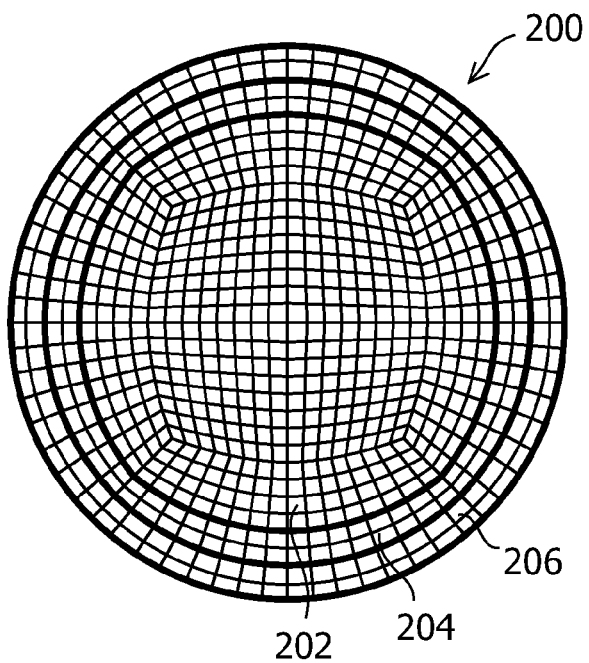
FIG. 2 is a computer display image showing a sectional view in another example of a conventional golf ball model.
Figure 3:
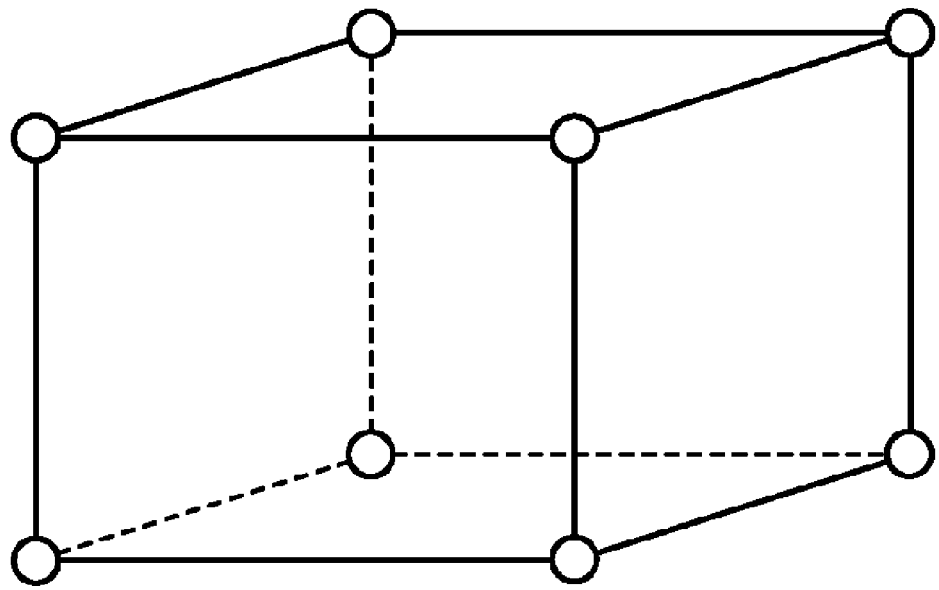
FIG. 3 is an explanatory view showing an example of a hexahedral element used in a conventional finite element method.
Figure 4:
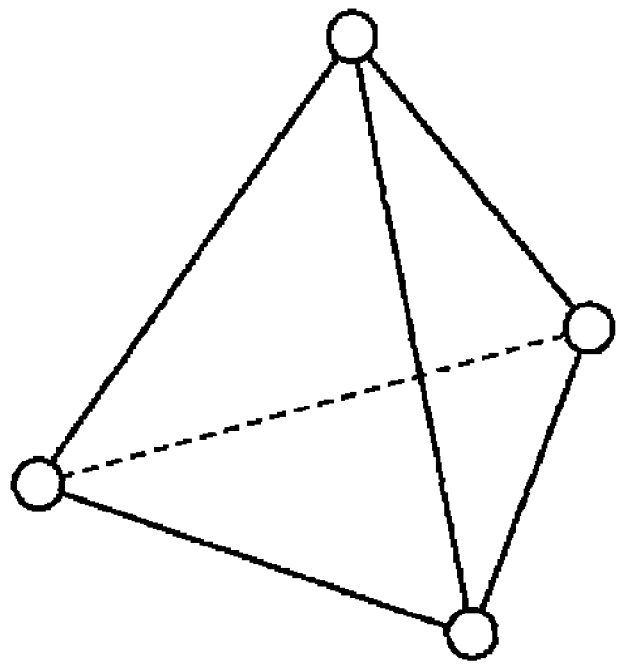
FIG. 4 is an explanatory view showing an example of a tetrahedral element used in a conventional finite element method.
Figure 5:
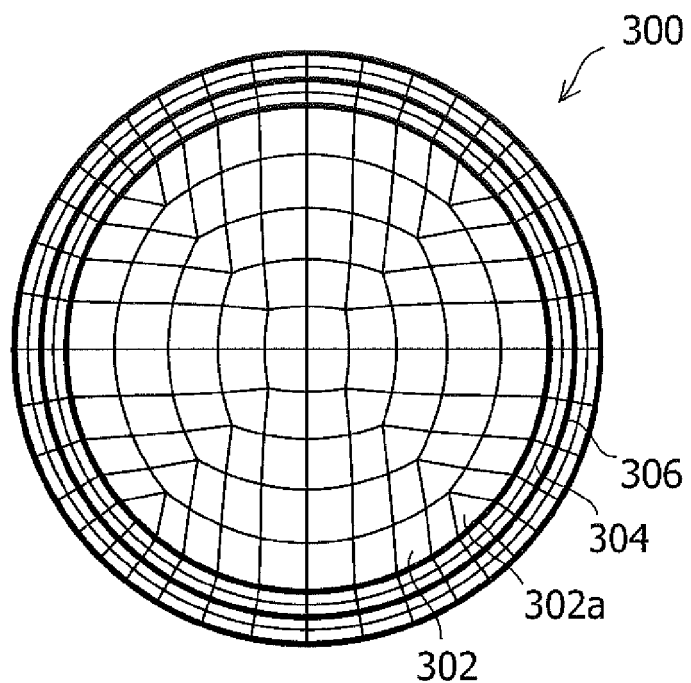
FIG. 5 is a sectional view showing a golf ball model used in a conventional finite element method.

In the inner layer zone 22 (core zone) shown in FIG. 7, solid elements each having a hexahedral shape are arranged. Each of these hexahedral elements is provided with twenty nodes 32 as shown in FIG. 8. In the case where an ordinary hexahedral element is used, the nodes are arranged only at eight vertexes of the hexahedral element (FIG. 3). In the embodiment of the present invention, in addition to such vertexes, a node is added at a middle point of each side, by which a total of twenty nodes 32 are used.

Figure 8:
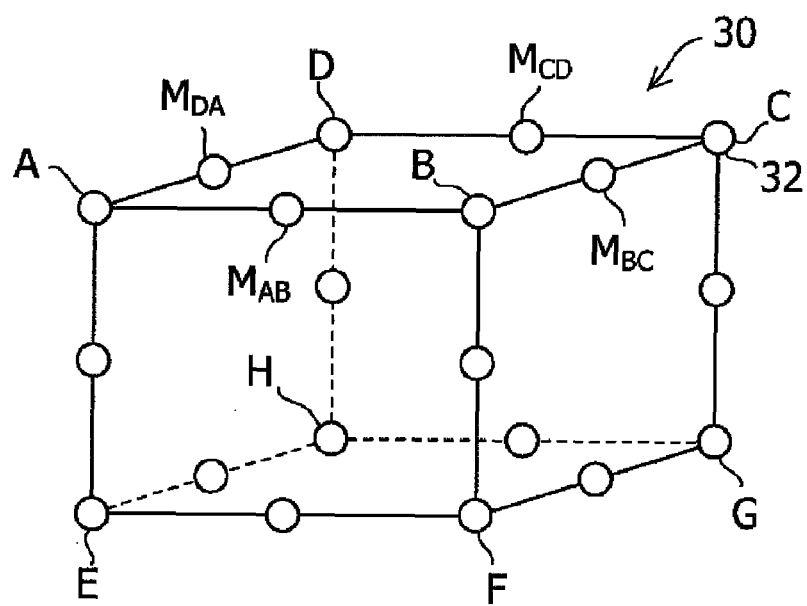
FIG. 8 is an explanatory view showing an example of a hexahedral element used in a mode of the present invention.

The hexahedron shown in FIG. 8 has eight vertexes A to H. The arrangement of nodes is explained specifically. A face ABCD is surrounded by sides (edges) AB, BC, CD and DA.

These sides have middle points $M_{AB}$, $M_{BC}$, $M_{CD}$ and $M_{DA}$, respectively. Concerning the face ABCD, the nodes are provided not only at four vertexes of A to D but also at the middle points $M_{AB}$, $M_{BC}$, $M_{CD}$ and $M_{DA}$. Other faces and the relating middle points are the same as described above. In the embodiment of the present invention, similar middle points are provided at all sides of the hexahedron, and these middle points serve as the nodes.

The inner layer zone (core zone) 22 shown in FIG. 7 is separated from an outer layer zone (intermediate layer) 24 by a spherical face whose center is the center of the golf ball model. Similarly, the outer layer zone (intermediate layer) 24 is separated from an outermost layer zone (cover zone) 26 by a similar spherical face having a larger radius. The elements in the outer layer zone 24 and the outermost layer zone 26 are solid elements.

Covering the overall scope of the present invention, the hexahedron is not necessarily limited to a mathematically accurate hexahedron, that is, a solid body surrounded by six planar faces. Each face is not always a perfect planar face, and may include a deformed face such that a face with four vertexes, where one vertex of the four vertexes specifying that face deviates from a plane formed by three other vertexes is also included. This deformation from a plane may be a deformation occurring as a result of simulation of deformation performed by computation or may be a deformation existing at the stage at which the elements are generated. In the actual element, the amount of this deformation is minute in almost all cases.

Also, the aspect ratio in the present invention is defined including the above-described cases. The aspect ratio is determined for an element at a stage at which a mesh or elements are prepared. That is to say, the aspect ratio of an element is defined as a value obtained by dividing the length of the longest side by the length of the shortest side of all of the sides of the element. Applying this definition to the element 30 shown in FIG. 8, the aspect ratio is calculated by dividing the length of a side having the longest length by the length of a side having the shortest length of the sides AB, BC, CD, DA, EF, FG, GH, HE, AE, BF, CG, and DH.

Mesh Generation

In the model 20 shown in FIG. 7, in the outer layer zone 24 and the outermost layer zone 26, which are modeled by using solid elements, shell elements can also be used in place of the solid elements depending on the objective and condition of computation. The aforementioned solid model can perform computation by using relatively many nodes, so that it can properly simulate a material having not only elasticity but also viscosity (for example, including a rubber-based material), and provides high computation accuracy. In contrast, in the conditions in which the material used as the outer layer zone 24 and the outermost layer zone 26 need not consider such viscosity, even computation using the shell elements, not the solid elements, can achieve sufficiently excellent computation accuracy. Examples of such condition include, but are not limited to, a condition in which dependence is negligible, and a static condition in which a material for the golf ball cover can be selected without taking a viscosity into account due to high hardness. The shell element features relatively high computation speed as compared with the solid element because the amount of computation can be reduced.

The model shown in FIG. 7 is prepared by using the preprocessor as described above (Step 12 in FIG. 6). The specific means for preparing such a model is explained in further detail. In the embodiment of the present invention, as one example, the preprocessor is used after a face for obtaining elements by using 3D-CAD has been defined. Specifically, in the case of this example, first, geometry of a sphere representing a spherical golf ball by using 3D-CAD and a face for finally obtaining elements of a mesh in the interior of the sphere is defined. Thereafter, the mesh is generated on the defined geometry by using the preprocessor.

Before the generating mesh, first, the inner layer zone, outer layer zone, and outermost layer zone are defined. In the xyz coordinates in which the position corresponding to the center of golf ball is taken as the origin O of coordinates, by using $r_1$ and $r_2$ having the relationship of $r_1 < r_2 < r_0$ when the radius of the golf ball is taken as $r_0$, definition is made so that a zone meeting the condition $\{x,y,z|r=(x^2+y^2+z^2)^{1/2} \leq r_1\}$ is the inner layer zone (symbol 22 in FIG. 7), a zone meeting the condition $\{x,y,z|r_1 < r \leq r_2\}$ is the outer layer zone (symbol 24 in FIG. 7), and a zone meeting the condition $\{x,y,z|r_2 < r \leq r_0\}$ is the outermost layer zone (symbol 26 in FIG. 7). The values (sizes) of $r_1$ and $r_2$ are determined in accordance with the sizes of the core, intermediate layer, and cover of the golf ball to be simulated. In FIG. 7, circles that are cross sections of spheres having the radiuses $r_1$ and $r_2$ are shown by thick lines indicating a boundary for separating the inner layer zone 22 and the outer layer zone 24 from each other and a boundary for separating the outer layer zone 24 and the outermost layer zone 26 from each other, respectively. Hereunder, unless otherwise specified, paying attention to the symmetric property of a sphere, only a quadrant in which all of x, y and z are positive is explained.

After the ranges of the inner layer zone, outer layer zone, and outermost layer zone have been determined, the mesh of the inner layer zone 22 is generated. In the inner layer zone 22, the mesh is generated by broadly dividing the zone 22 into a central part 224 and a peripheral part 222. The central part 224 includes the center (origin), and is formed by laminating distorted cubes in equal numbers in the directions of x, y and z. In FIG. 7, the y-z plane spreads so that a quadrilateral zone formed by the origin O and points 226y and 226z shown on the y and z axes is a cut surface on the y-z plane. At this time, the length from the origin O to the point 226z and the length from the origin O to the point 226z (y coordinate value of point 226y and z coordinate value of point 226z) are equal to each other. However, a point 228 that is a diagonal point of the origin O is located at a position so as to approach the origin in the case in which the quadrilateral O-226y-228-226z is a square. The same is true for the x-y plane and z-x plane (not shown). Furthermore, the central part 224 has a vertex farthest from the origin on a straight line x=y=z. A range defined by the quadrilateral O-226y-228-226z on the y-z plane, quadrilaterals on the xy plane and the z-x plane corresponding to the quadrilateral O-226y-228-226z, and the vertex on a straight line x=y=z forms a hexahedron half-space in which all of x, y and z are positive. As described above, the planes of this hexahedron need not be perfect planes in the mathematical meaning. In the quadrant in which at least any one of x, y and z is negative as well, the boundary of the central part 224 is defined by repeating the similar procedure.

The mesh of the inner layer zone 22 is first generated so as to form a 12×12×12 uniform elements zone in the central part 224 defined as described above. Restricting to the quadrant in which all of x, y and z are positive, the mesh is generated so as to form a 6×6×6 elements zone. In the generated mesh, each element is a three-dimensional solid with a distorted cubic shape, and even if the element edges adjacent to each other are connected in a specific quadrant in the central part 224, a straight line, not a polygonal line, is formed. The number of mesh sectioning is not limited to the above-described number. This mesh can be generated automatically by the function of preprocessor when the preprocessor receives central part definition data, for example, by receiving an input from the user or receiving a proper electronic file. Using the model shown in FIG. 7 as an example, this central part definition data includes a numeric value for determining the size of the central part 224 itself such as the y coordinate value of point 226y and the z coordinate value of point 226z, a numeric value for determining the shape of the central part 224 such as the position of the vertex farthest from the origin O on the straight line x=y=z, and a numeric value for determining the mesh generation size in the central part 224 such as the number of elements arranged in the central part.

Next, the mesh of the peripheral part 222 of the inner layer zone 22 is generated. The peripheral part 222 surrounds the central part 224 and is configured so that the outermost face thereof is inscribed in the outer layer zone 24. The mesh of the peripheral part 222 is generated as described below. First, a straight line passing through intersection points (vertexes of element) of the mesh appearing on the outermost face of the central part 224 and the origin O are extended in large numbers. On each of the straight lines, a line segment specified by the boundary between the central part 224 and the peripheral part 222 and a spherical face having the radius $r_0$ is determined. This line segment is hereinafter called a "radius line segment", an example of which is a line segment 230 in FIG. 7. Furthermore, on each of the line segments, two internal division points that divide a portion existing in the peripheral part 222 of each radius line segment into three equal parts are provided. A pair of radius line segments connected to each other by the edge on the face of the boundary between the central part 224 and the peripheral part 222 are selected. A segment formed by connecting the internal division points in the same order from the origin O of the internal division points lying on the paired radius line segments is made a new edge. By adding the radius line segments to this new edge, the mesh is generated. This processing is performed for all pairs of radius line segments, by which the mesh of the peripheral part 222 is completed. In the present invention, the data for defining such a mesh is called peripheral part definition data. This data may be generated interactively by the operation of a preprocessor performed by the user or may be automatically generated in whole or in part. To generate the mesh, the computer calls this peripheral part definition data. In the above-described example, this peripheral part definition data can include data for determining the size of the whole of the peripheral part, such as the radius ($r_1$), and can further include data capable of determining whether or not internal division points are provided on the radius line segment or into what number of parts the radius line segment is divided equally if the internal division points are provided.

The mesh of the outer layer zone 24 is generated by determining points at which the radius line segment intersects a spherical face having the radius $r_1$ and a spherical face having the radius $r_2$ by utilizing the above-described radius line segment and by using the edge connecting these intersection points to each other and the edge formed by the radius line segment itself. The outer layer zone 24 is not divided in the radius direction. The mesh of the outermost layer zone 26 is also generated in the same way. To process the outer layer zone 24, outer layer zone definition data is called by the computer. This outer layer zone definition data can also include data for determining the size of the whole of the outer layer zone, such as the radius ($r_2$) and data concerning the internal division point in the outer layer zone. Similarly, to process the outermost layer zone 26, outermost layer zone definition data is called by the computer. The outermost layer zone definition data can also include the same data as the outer layer zone definition data.

Provision of Nodes

Next, the vertexes and the middle points between the adjacent two vertexes are made nodes. In this embodiment, the adjacent two vertexes are adjacent two vertexes belonging to a common edge, and whether the vertexes are adjacent or not is not judged by the distance therebetween. Since the condition data for designating a node can be obtained by receiving the user's selection, at the stage at which the mesh is cut by the preprocessor, the condition can be defined so that twenty nodes are set automatically in each element.

Provision of Material Parameters

Each element is provided with a material parameter. A parameter (physical property data) necessary for the simulation, such as a parameter for specifying elasticity for each element and a parameter for specifying viscosity (generally called a physical property), is provided according to the golf ball to be simulated. In the case in which the objective of the simulation is to determine a change in mechanical behavior due to the material by changing the material only while the sizes of the cover, intermediate layer, and core are maintained, the generation of mesh and the provision of nodes are accomplished in advance, and the operation can also be performed so that only the material parameter is chosen successively from a predetermined range of the parameter. In the present invention, by the above-described processing, data used for computation by the solver (Step 14) can be generated.

First Embodiment

In some modes of the present invention, on each face of each element in the core zone, the aspect ratio is set so as to be not lower than 1.0 and not substantially higher than 1.5. Also, in a further preferable mode, the aspect ratio is set so as to be not lower than 1.0 and not substantially higher than 1.35. In an analysis method using a model having the aspect ratio specified above, a satisfactory analysis can be carried out for the spherical shape of a golf ball.

Furthermore, in the present invention, if the aspect ratio is set so as to be not lower than 1.0 and not substantially higher than 4.5 for all solid elements including other than the core zone, satisfactory analysis can be carried out. Also, further preferably, if the aspect ratio is set so as to be not lower than 1.0 and not substantially higher than 2.5, further satisfactory analysis can be carried out.

As described above, in the case in which the aspect ratio of solid element including other than the core zone is set at about 6.5, high computation accuracy is not obtained, and by comparison, in the case in which the aspect ratio is set at about 4.5, high computation accuracy can be achieved. Furthermore, in the case in which the aspect ratio is set at about 2.5, analysis can be carried out with further high computation accuracy.

Second Embodiment

Also, the element in the core zone can be specified by a volume ratio, not the aspect ratio. If the volume of an element having the maximum volume in the core zone has a volume of about 3.5 times or less, further preferably about 2.5 times or less, the volume of an element having the minimum volume, satisfactory analysis can be carried out.

Thus, in the case in which the volume ratio of element in the core zone is 4.5, sufficient computation accuracy is not obtained. However, in the case in which the volume ratio is about 3.5, high computation accuracy can be obtained, and in the case in which the volume ratio is about 2.5, further high computation accuracy can be obtained, and satisfactory analysis can be carried out.

Third Embodiment

In the embodiment of the present invention, the number of nodes in a model indicates the number of output points of the finite element method. Therefore, this embodiment achieves an effect of improved computation accuracy due to the increase in the number of output points. To confirm this effect, an analysis was made by changing the number of nodes provided on the element in the range of 8 to 20. As the result, it is found that in the case in which the number of nodes is set at 8, 12 or 16, sufficient computation accuracy is not obtained, and by comparison, in the case in which the number of nodes is set at 20, analysis can be carried out with high computation accuracy.

Fourth Embodiment

Furthermore, in an embodiment of the present invention, from the central part definition data, the peripheral part definition data, the outer layer zone definition data, and the outermost layer zone definition data, the aspect ratio of the shape of each element can be calculated, the aspect ratio of the shape of the element in the core zone can be calculated, and the volume ratio of the element in the core zone can be calculated. For this purpose, the computer can have a numerical calculation processing unit for calculating the geometric shape of element from each data. Thereby, before the actual computation using the finite element method, which uses a model, is made by the solver, the numeric values of the aspect ratio of the shape of each element, the aspect ratio of the shape of the element in the core zone, and the volume ratio of the element in the core zone can be obtained. For example, by offering such numeric values to the user, the user can recognize the features of the model prepared by the user. Thereby, the user can save time that would have been used for trial and error to improve the model.

EXAMPLE

As an example concerning the second and third embodiments of the present invention, the amount of deformation of a golf ball is computed by models A1, A2, B1, B2, C1 and C2 reflecting the features described in the above-described embodiments, and the amount of deformation of each model is compared with the amount of deformation of the actual golf ball.

All of the models A1, A2, B1, B2, C1 and C2 are the models of the finite element method of a golf ball prepared so that the diameter of the entire ball is 42.7 mm, each of these models having a structure consisting of a core, an intermediate layer, and a cover. Among these models, models A1 and A2 have the same element generation mode determined by a mesh and the same physical property values caused to correspond to each element. Models A1 and A2 differ from each other in that the number of nodes provided to each element is eight for model A1, whereas the number is twenty for model A2. Similarly, in models B1 and B2, the element generation mode and the physical property values caused to correspond to each element are the same. The same holds true for models C1 and C2. Like models A1 and A2, the number of nodes provided to each element is eight for models B1 and C1, whereas the number is twenty for models B2 and C2. Hereinafter, models A1 and A2 are collectively described as model A. The same holds true for models B and C.

Model A is a reference model, model B is a model in which the number of elements in the core is increased as compared with model A, and model C is a model in which the volume ratio of an element of the maximum volume among core elements to an element of the minimum volume (hereinafter, referred simply to as "volume ratio") is higher than that of model A. Here, models A and B are models each having a structure shown in FIG. 7, and model A is a 4-layer model having 2 layers in the core, 1 layer in the middle, and 1 layer in the cover, and models B and C are 7-layer models, each having 5 layers in the core, 1 layer in the middle, and 1 layer in the cover. For each element of each model, parameters like the specific gravity (density), the Poission's ratio, Young's modulus, in accordance with the materials for each layer, and diameters.

For the computation using the models, a numeric value called "amount of deformation at 130 kg hardness" is computed. For models A and B, computation using the parameters of physical property values and shape of the actual golf ball is made, and for model C as well, computation is made similarly by reflecting the parameters of physical property values and the shape of the actual golf ball. Table 1 gives the features and computation results of models A1, A2, B1, B2, C1 and C2 used for the computation. As the features of the model, an entire maximum aspect ratio, a core maximum aspect ratio, a volume ratio in the core, and the number of elements are shown. In this specification, the entire maximum aspect ratio means the maximum value of aspect ratio of all elements, and the core maximum aspect ratio means the maximum value of aspect ratio of the elements of the core. Also, the volume ratio in the core means a ratio of the volume of an element having the maximum volume to the volume of an element having the minimum volume for the elements in the core zone, and the number of elements means the number of elements counted as a whole. The computation results are computed values of the amount of deformation at 130 kg hardness.

TABLE 1

| | Model A1 8 nodes | Model A2 20 nodes | Model B1 8 nodes | Model B2 20 nodes | Model C1 8 nodes | Model C2 20 nodes |
|---|---|---|---|---|---|---|
| Entire maximum aspect ratio | 4.20 | | 4.25 | | 4.23 | |
| Core maximum aspect ratio | 2.55 | | 3.25 | | 1.77 | |
| Volume ratio in core | 1.45 | | 2.10 | | 2.59 | |
| Number of all elements | 2816 | | 4352 | | 3400 | |
| Deformation at 130 kg hardness (mm) | 2.47 | 2.35 | 2.42 | 2.37 | 2.53 | 2.44 |

Figure 9:
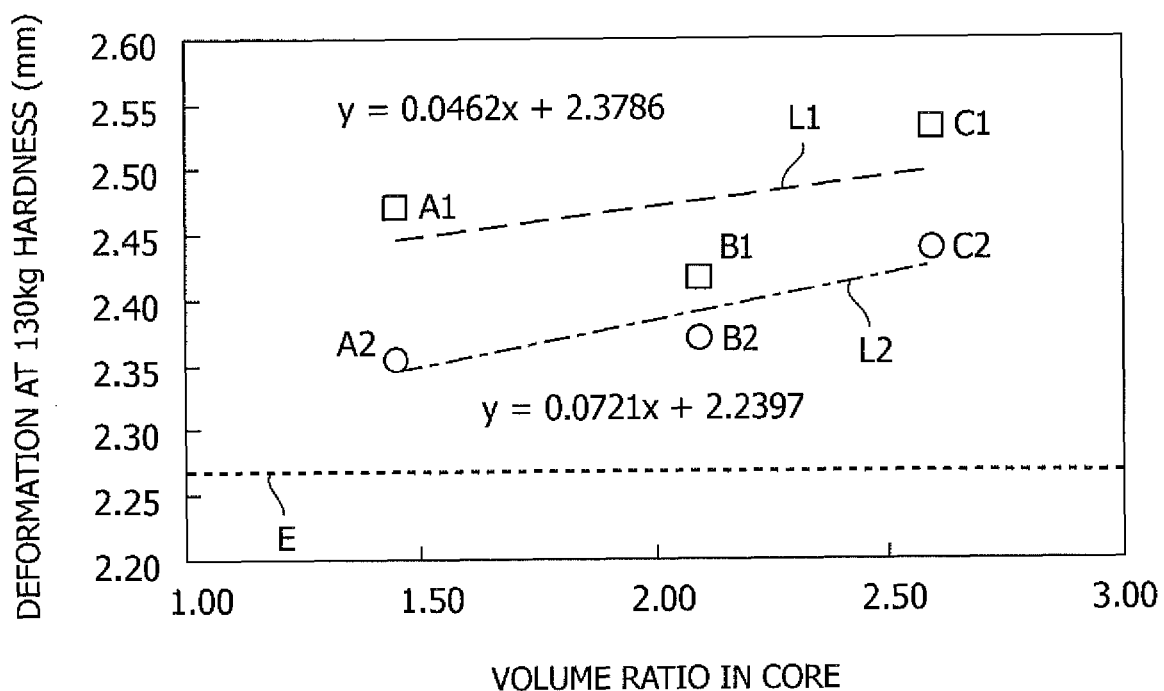
FIG. 9 is a graph showing the amount of deformation computed by a golf ball model used in the example of the present invention.

FIG. 9 is a graph showing the above-described computation results. The abscissas of FIG. 9 represent the volume ratio in the core, and the ordinates represent the amount of deformation at 130 kg hardness, which is the computation result. In FIG. 9, a straight line calculated by the least squares method from the computation results of models A1, B1 and C1 is shown by a broken line L1, and similarly a straight line calculated from the computation results of models A2, B2 and C2 is also shown by a chain line L2. Near these straight lines, expressions of these straight lines themselves are also described. In addition, in FIG. 9, a dotted line E showing the value of the amount of deformation actually measured in a golf ball, which is 2.27 mm, is also shown in the graph.

In FIG. 9, first, models A1 and B1 are compared with each other. As shown in Table 1, model A1 and B1 are similar to other in that the number of nodes per element is eight, and they have a relationship such that model B1 corresponds to a model in which the number of elements of model A1 is increased. In these models having such a relationship, it seems that a proposition that as the number of elements increases, more accurate computation (computation approximate to the real value) can be made holds. However, if an attempt is made to explain this proposition in regard to model A2 and model B2 each having twenty nodes per element, a contradiction occurs. That is to say, model B2 having many elements is separate from the real value shown by the dotted line E as compared with model A2. Thus, it is found that the increase in the number of elements in realizing the computation exactly reproducing the amount of deformation is not necessarily sufficient. Rather, as viewed from model A1, model A2 in which the number of nodes is increased contributes to the computation accuracy more greatly than model B1 in which the number of elements is increased.

Furthermore, regarding the shape of the element, by comparing model C having elements more than model A and fewer than model B with model A or model B, it is found that in a model having elements like tetrahedral elements rather than hexahedral elements, the computation accuracy is poor.

Also, FIG. 9 shows a general tendency for the computation accuracy to increase more in the case in which the volume ratio in the core is low. That is to say, in both the tendency shown by the series of models A1, B1 and C1 and the tendency shown by the series of models A2, B2 and C2, the computation accuracy increases as the volume ratio in the core approaches one.

As described above, to increase the computation accuracy, it can be said that the following conditions are effective: a model having twenty nodes per element rather than a model having eight nodes per element should be used; a model represented by hexahedral elements should be used, and an element having a shape close to that of a tetrahedron should not be used; and a model having a low volume ratio should be used.

In the case in which such computation is made in the finite element method, the computation time mainly depends on the number of hexahedral elements. Thus, in the embodiment of the present invention, the computation accuracy can be improved.

The various embodiments described above can be combined to provide further embodiments. All of the U.S. patents, U.S. patent applications, U.S. patent applications, foreign patents, foreign patent applications, and non-patent publications referred to in this specification and/or list in the Application Data Sheet are incorporated herein by reference, in their entirety. Aspects of the embodiments can be modified, if necessary to employ concepts of the various patents, applications and publications to provide yet further embodiments.

These changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to whish such claims are entitled. Accordingly, the claims are not limited by the disclosure.

We claim:

1. A method for analyzing mechanical behavior of a golf ball comprising:
    preparing a model representing a golf ball by a collection of hexahedral elements;
    setting nodes at vertexes and sides of the hexahedral elements, the hexahedral elements adjacent to each other sharing the nodes; and
    computing mechanical behavior involving deformation of the golf ball by using a finite element method using the elements and nodes of the model, the nodes being used as output points of computation,
    wherein the aspect ratio of the shape of each of the elements is not lower than 1.0 and not higher than 6.5,
    the model is divided into a plurality of zones separated from each other by a spherical face whose center is the center or the center of gravity of the golf ball,
    the plurality of zones include a core zone having the center or the center of gravity of the golf ball therein and a outer layer zone positioned around the outside of the core zone,
    the hexahedral elements in the outer layer zone are defined without dividing into finer sized sections in the radius direction than the hexahedral element in the core zone, and
    in the elements in the core zone, a volume ratio, which is a ratio of the volume of an element having the maximum volume to the volume of an element having the minimum volume, is not lower than 1.0 and not higher than 3.5.

2. The method according to claim 1, wherein at least some of the elements are solid elements, and at least twenty nodes are provided on each of the solid elements.

3. The method according to claim 1, wherein at least some of the elements are solid elements, and each of the nodes provided on sides is placed at a middle point of the side.

4. The method according to claim 1, wherein any of the zones is represented by a collection of shell elements.

5. The method according to claim 1, wherein the model is configured so that in the core zone , the aspect ratio of the shape of each element is not lower than 1.0 and not higher than 1.5.

6. The method according to claim 5, wherein the model is configured so that the aspect ratio is not lower than 1.0 and not higher than 1.35.

7. The method according to claim 1, wherein the model is configured so that in all elements included in the model, the aspect ratio of the shape of each element is not lower than 1.0 and not higher than 4.5.

8. The method according to claim 1, wherein the volume ratio is not lower than 1.0 and not higher than 2.5.

9. A golf ball analyzed or designed by using the mechanical analysis as described in claim 1.

10. The method according to claim 1, wherein the number of hexahedral elements is from 2816 to 4352.

* * * * *